(12) United States Patent
van Muiswinkel et al.

(10) Patent No.: US 6,806,705 B2
(45) Date of Patent: Oct. 19, 2004

(54) DIFFUSION TENSOR MAGNETIC RESONANCE IMAGING INCLUDING LOCAL WEIGHTED INTERPOLATION

(75) Inventors: Arianne M. C. van Muiswinkel, BR Best (NL); Ronaldus F. J. Holthuizen, GT Son en Breugel (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 70 days.

(21) Appl. No.: 10/145,916

(22) Filed: May 15, 2002

(65) Prior Publication Data

US 2003/0214289 A1 Nov. 20, 2003

(51) Int. Cl.$^7$ .............................................. G01V 3/00
(52) U.S. Cl. ...................................... 324/307; 324/309
(58) Field of Search ................................ 324/307, 309, 324/318, 322; 600/410; 128/653.2

(56) References Cited

U.S. PATENT DOCUMENTS

| | | | |
|---|---|---|---|
| 5,488,297 A | 1/1996 | Nakada | 324/309 |
| 5,539,310 A | 7/1996 | Basser et al. | 324/307 |
| 5,560,360 A | * 10/1996 | Filler et al. | 128/653.1 |
| 5,969,524 A | * 10/1999 | Pierpaoli et al. | 324/307 |
| 6,526,305 B1 | * 2/2003 | Mori | 600/410 |

FOREIGN PATENT DOCUMENTS

JP 1100320 1/1999

OTHER PUBLICATIONS

Mori, et al., "Imaging Cortical Association Tracts in the Human Brain Using Diffusion–Tensor–Based Axonal Tracking", Magnetic Resonance in Medicine 47:215–223 (2002).

Courant, et al. "Methods of Mathematical Physics", Interscience Publishers New York, vol. 1, ©1937, pp. 458–459.

Kindlmann, et al., "Strategies for Direct Volume Rendering of Diffusion Tensor Fields", IEEE Trans. on Visualization and Computer Graphis, IEEE Service Center, Piscataway, NJ, US vol. 6, No. 2, Apr. 2000 pp. 124–138.

Tournier, et al., "Limitations and Requirements of Diffusion Tensor Fiber Tracking: An Assessment Using Simulations", Magnetic Resonance in Medicine, Apr. 2002, Wiley, US, vol. 47, No. 4, pp. 701–708.

Conturo, et al., "Tracking Neuronal Fiber Pathways in the Living Human Brain", Proceed. of the National Academy of Sciences of USA, Aug. 31, 1999, US vol. 96, No. 18, pp. 10422–10427.

Peled, et al., "Superresolution in MRI: Application to Human White Matter Fiber Tract Visualization by Diffusion Tensor Imaging", Magnetic Resonance in Medicine, Academic Press, Duluth, MN US vol. 45, No. 1, Jan. 2001.

* cited by examiner

*Primary Examiner*—Brij B. Shrivastav
(74) *Attorney, Agent, or Firm*—Thomas M. Lundin

(57) ABSTRACT

An imaging method (150, 190) for imaging a subject (16) including fibrous or anisotropic structures (102) includes acquiring a three-dimensional apparent diffusion tensor map (162) of a region with some anisotropic structures (102). The apparent diffusion tensor at a voxel is processed (164) to obtain eigenvectors ($e_1$, $e_2$, $e_3$) and eigenvalues ($\lambda_1$, $\lambda_2$, $\lambda_3$). A three-dimensional fiber representation (208) is extracted (198, 200) using the eigenvectors and eigenvalues. During the extracting (198, 200), voxels are locally interpolated (202) in at least a selected dimension in a vicinity of the fiber representation (208). The interpolating includes weighting the voxels by a parameter indicative of a local anisotropy. The interpolating results in a three-dimensional fiber representation (208) having a higher tracking accuracy and representation resolution than the acquired tensor map (162).

25 Claims, 5 Drawing Sheets

DIFFUSION TENSOR MAGNETIC RESONANCE IMAGING INCLUDING LOCAL WEIGHTED INTERPOLATION

BACKGROUND OF THE INVENTION

The present invention relates to the three-dimensional imaging arts. It particularly relates to the imaging, tracking, and displaying of neural fibers and fiber bundles by diffusion tensor magnetic resonance imaging (DT-MRI), and will be described with particular reference thereto. However, the invention will also find application in conjunction with the tracking and graphical rendering of other types of fibrous structures as well as with other imaging modalities such as single photon emission computed tomography imaging (SPECT), computed tomography (CT), positron emission tomography (PET), and the like.

Nerve tissue in human beings and other mammals includes neurons with elongated axonal portions arranged to form neural fibers or fiber bundles along which electro-chemical signals are transmitted. In the brain, for example, functional areas defined by very high neural densities are typically linked by structurally complex neural networks of axonal fiber bundles. The axonal fiber bundles and other fibrous material are substantially surrounded by other tissue.

Diagnosis of neural diseases, planning for brain surgery, and other neurologically related clinical activities as well as research studies on brain functioning can benefit from non-invasive imaging and tracking of the axonal fibers and fiber bundles. In particular, diffusion tensor magnetic resonance imaging (DT-MRI) has been shown to provide image contrast that correlates with axonal fiber bundles. In the DT-MRI technique, diffusion-sensitizing magnetic field gradients are applied in the excitation/imaging sequence so that the magnetic resonance images include contrast related to the diffusion of water or other fluid molecules. By applying the diffusion gradients in selected directions during the excitation/imaging sequence, diffusion weighted images are acquired from which apparent diffusion tensor coefficients are obtained for each voxel location in image space.

Fluid molecules diffuse more readily along the direction of the axonal fiber bundle as compared with directions partially or totally orthogonal to the fibers. Hence, the directionality and anisotropy of the apparent diffusion coefficients tend to correlate with the direction of the axonal fibers and fiber bundles.

Extraction of fibrous structure information from DT-MRI images is computationally intensive, with processing times typically extending from several tens of minutes to an hour for clinically valuable images, volumes, models or parameters. To keep the processing time within reasonable limits and to improve the signal-to-noise ratio, relatively low resolution images are usually acquired for fibrous structure tracking. For example, volumes of 30–40 slices, each of 128×128 voxels with a linear reconstructed voxel dimension of about 2 mm, and a 2 mm slice resolution, is typical. This relatively coarse resolution affects the appearance of the tracked fiber representation in displayed renderings. Since the fibrous structure tracking is generally performed three-dimensionally, each factor of two increase in acquired image resolution corresponds to about a factor of eight increase in computing time and memory usage.

The present invention contemplates an improved apparatus and method which overcomes the aforementioned limitations and others.

SUMMARY OF THE INVENTION

According to one aspect of the invention, an imaging method is provided for imaging a subject including aniso-tropic structures. A three-dimensional apparent diffusion tensor map of at least a portion of the subject including at least some anisotropic structures is acquired. The apparent diffusion tensor is processed at a voxel to obtain eigenvectors and eigenvalues. A three-dimensional fiber representation is extracted using the eigenvectors and eigenvalues. During the extracting, voxels are locally interpolated in at least a selected dimension in a vicinity of the fiber representation. The interpolating includes weighting the interpolated voxels by a parameter indicative of a local anisotropy. The interpolating resulting in a three-dimensional fiber representation that has a higher resolution than the acquired tensor map. A human-viewable display of the three-dimensional fiber representation is produced.

According to another aspect of the invention, an apparatus is disclosed for tracking fibrous structures in a subject. A magnetic resonance imaging scanner is configured to acquire diffusion-weighted imaging data. A reconstruction processor reconstructs the acquired diffusion-weighted imaging data into diffusion-weighted image representations. A diffusion tensor mapping processor constructs a diffusion tensor map by selectively combining selected diffusion-weighted image representations. An eigenvalues/eigenvectors processor determines ordered eigenvalues and eigenvectors of the diffusion tensor corresponding to voxels. A fibrous structure tracking processor computes a fibrous structure representation based on the eigenvalues and eigenvectors and at least one starting voxel selection. An interpolation processor cooperating with the fibrous structure tracking processor increases a resolution of the fibrous structure representation by locally interpolating voxels in a neighborhood of the fibrous structure during computation of the fibrous structure representation. A display device displays at least a portion of the fibrous structure representation in a human-viewable medium.

According to yet another aspect of the invention, a method is provided for tracking fibrous structures in an apparent diffusion tensor map including a three-dimensional arrangement of diffusion tensor voxels. A starting voxel is selected. Beginning at the starting voxel, an eigenvector corresponding to a largest eigenvalue is iteratively followed from voxel to voxel to construct a three-dimensional fiber representation. During the iterative following, voxels are locally interpolated. The locally interpolated voxels are weighted combinations of nearby diffusion tensors.

One advantage of the present invention resides in an improved smoothness of the tracked fiber representation.

Another advantage of the present invention resides in improved computational speed and reduced memory usage.

Yet another advantage of the present invention resides in improved tracking accuracy with higher resolution.

Numerous additional advantages and benefits of the present invention will become apparent to those of ordinary skill in the art upon reading the following detailed description of the preferred embodiment.

BRIEF DESCRIPTION OF THE DRAWINGS

The invention may take form in various components and arrangements of components, and in various steps and arrangements of steps. The drawings are only for the purpose of illustrating preferred embodiments and are not to be construed as limiting the invention.

DETAILED DESCRIPTION OF THE PREFERRED EMBODIMENTS

Figure 1:
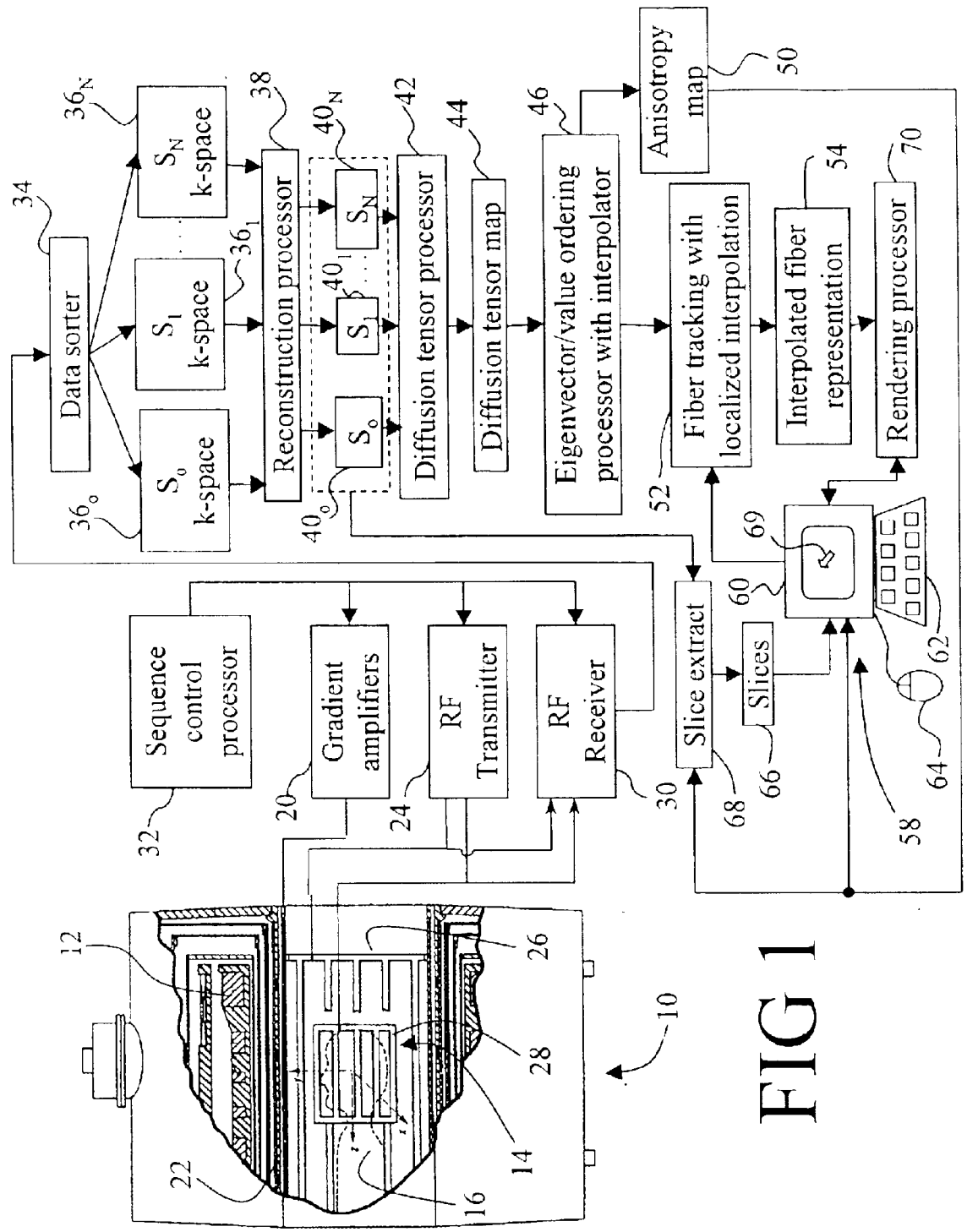
FIG. 1 schematically shows an exemplary magnetic resonance imaging (MRI) technique in accordance with one embodiment of the invention.

With reference to FIG. 1, a magnetic resonance imaging (MRI) scanner 10 typically includes superconducting or resistive magnets 12 that create a substantially uniform, temporally constant main magnetic field $B_0$ along a z-axis through an examination region 14. Although a bore-type magnet is illustrated in FIG. 1, the present invention is equally applicable to open magnet systems and other types of MRI scanners. Imaging is conducted by executing a magnetic resonance excitation and readout sequence with the subject being imaged, e.g. a patient 16, placed at least partially within the examination region 14, typically with the region of interest at the magnet isocenter. For diffusion tensor MRI imaging of the brain region, the patient's head is preferably placed at the isocenter, as shown.

The magnetic resonance sequence includes a series of RF and magnetic field gradient pulses that are applied to the subject 16 to invert or excite magnetic spins, induce magnetic resonance, refocus magnetic resonance, manipulate magnetic resonance, spatially encode, flow or diffusion encode the magnetic resonance, saturate spins, and the like. More specifically, gradient pulse amplifiers 20 apply current pulses to a whole body gradient coil assembly 22 to create magnetic field gradients along x-, y-, and z-axes of the examination region 14. In diffusion-weighted MRI, selected magnetic field gradients are applied to provide motion-related contrast sensitive to motion of fluid molecules in selected directions.

An RF transmitter 24, preferably digital, applies RF pulses or pulse packets to a whole-body RF coil 26 to transmit RF pulses into the examination region. A typical RF pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region.

For whole-body applications, the resulting resonance signals, generated as a result of a selected manipulation, are also picked up by the whole-body RF coil 26. Alternately, for generating RF pulses in limited regions of the subject, local RF coils are placed contiguous to the selected region. For example, in brain imaging an insertable head coil 28 is optionally employed.

Regardless of the RF coil configuration and the application thereof, the resultant RF magnetic resonance signals that are picked up by one or another of the RF coils is received and demodulated by an RF receiver 30, preferably a digital receiver. A sequence control processor 32 controls the gradient pulse amplifiers 20, the RF transmitter 24, and the RF receiver 30 to produce integrated MRI pulse sequence and readout waveforms that generate the magnetic resonance signals and optional echoes, provide appropriate encoding gradients to spatially and diffusion encode the resultant MR response, and coordinate MR pickup and receive operations.

The MRI sequence typically includes a complex series of magnetic field gradient pulses and/or sweeps generated by the gradient amplifiers 20 which along with selected RF pulses generated by RF coils 26, 28 result in magnetic resonance echoes that map into k-space. The resultant magnetic resonance data are sorted by a sorter 34 and stored in k-space memories 36. For diffusion tensor magnetic resonance imaging (DT-MRI), data is acquired without diffusion weighting, indexed 0, and with diffusion weighting in N directions, indexed 1 ... N. Preferably, N≧6. The static and diffusion weighted data are acquired and sorted into corresponding k-space memories $36_o$, $36_1$, ... $36_N$. The k-space data $36_o$, $36_1$, ... $36_N$ for the static and each diffusion-weighted image is processed by a reconstruction processor 38, which is typically an inverse Fourier transform processor or other reconstruction processor known to the art, to produce reconstructed image representations $S_o$, $S_1$, ... $S_N$ $40_o$, $40_1$, ... $40_N$. Typically, image $S_o$ $40_o$ is obtained without diffusion weighting.

For DT-MRI, apparent diffusion coefficients (ADC's) at selected directions are obtained by linear regression of images with different diffusion weightings. The ADC's for selected directions (i, j) are determined by acquiring a diffusion-weighted image $S_{i,j}$ diffusion weighted in the (i, j) direction. The diffusion weighted image $S_{i,j}$ relates to the unweighted image $S_o$ $40_o$ according to:

$$S_{i,j} = S_o e^{-B \cdot ADC^{i,j}} \tag{1},$$

where B is a magnetic field parameter and $ADC_{i,j}$ is the apparent diffusion coefficient for the (i, j) direction. The ADC is calculable from equation (1) as:

$$ADC_{i,j} = -\frac{1}{B} \ln\left(\frac{S_{i,j}}{S_o}\right). \tag{2}$$

Beneficially, image contrast resulting from mechanisms other than the diffusion weighting, such as $T_1$, $T_2$, $T_2$, and like image contrast mechanisms, are substantially removed by the linear regression. A diffusion tensor processor 42 calculates a plurality of ADC values on a per voxel basis according to equation (2) to construct a diffusion tensor map 44. Six diffusion directions typically provide sufficient information to construct the diffusion tensor at each voxel.

Figure 2:
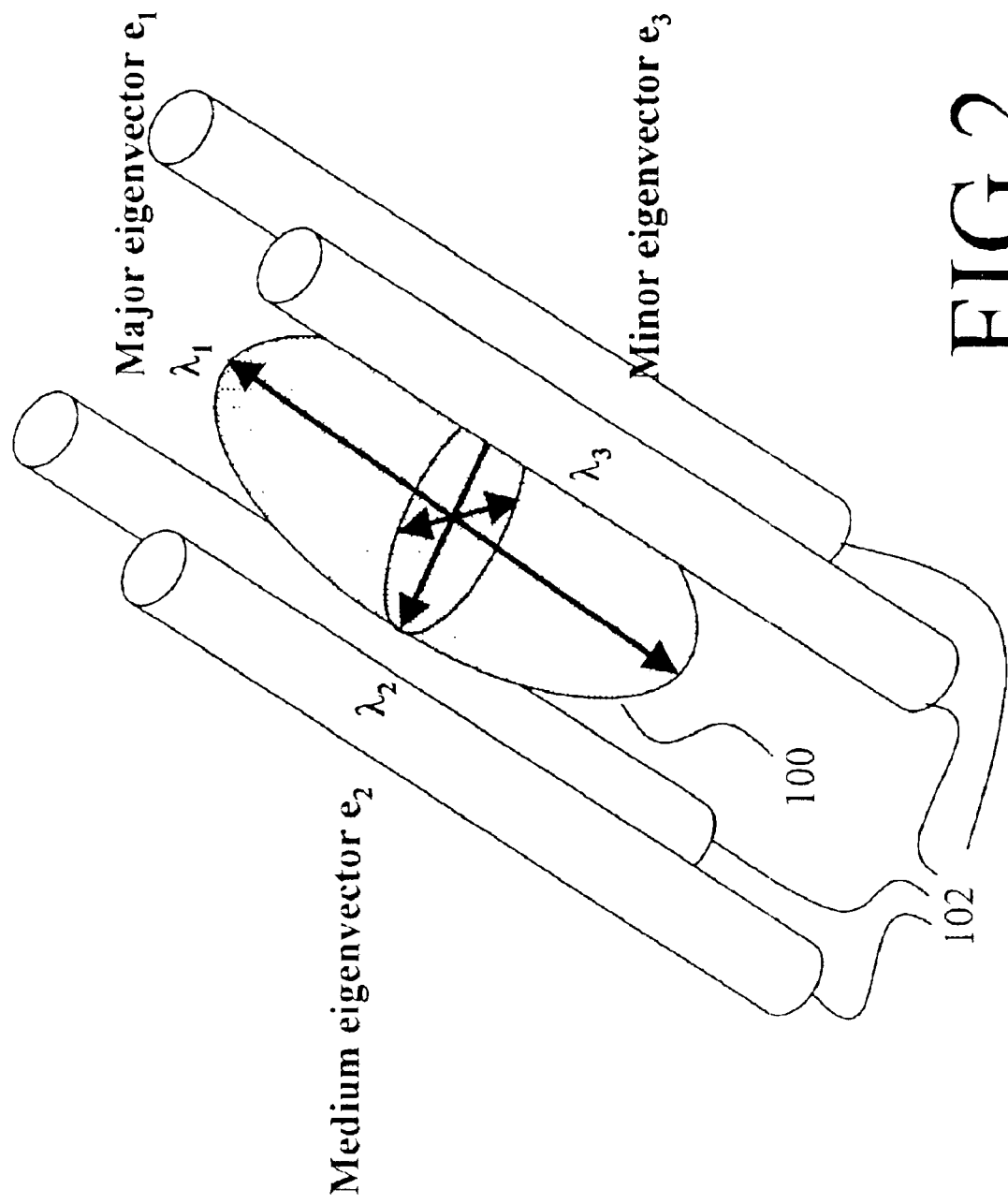
FIG. 2 diagrammatically illustrates the eigenvectors and eigenvalues of the diffusion coefficient tensor and their relationship with axonal fibers or fiber bundles.

With continuing reference to FIG. 1 and with further reference to FIG. 2, an eigenvector/eigenvalue ordering processor 46 orders the diffusion tensor eigenvectors and eigenvalues at voxels. As seen in FIG. 2, the ordered eigenvalues $\lambda_1$, $\lambda_2$, $\lambda_3$ (ordered from largest to smallest eigenvalue) and the corresponding eigenvectors $e_1$, $e_2$, $e_3$ of the diffusion tensor have useful physical significance. The largest eigenvalue is designated in FIG. 2 as $\lambda_1$. The corresponding eigenvector $e_1$ is called the major eigenvector, and aligns with the spatial direction having the highest diffusion coefficient. The remaining eigenvalues $\lambda_2$, $\lambda_3$ have corresponding eigenvectors $e_2$, $e_3$ called the medium and minor eigenvectors in FIG. 2. These eigenvectors $e_2$, $e_3$ are orthogonal to $e_1$ and align with spatial directions having lower diffusion coefficients. The relative values of the eigenvalues $\lambda_1$, $\lambda_2$, $\lambda_3$ are indicative of the spatial orientation and magnitude of the diffusion tensor anisotropy.

With continuing reference to FIG. 2, the eigenvectors and eigenvalues are geometrically representable by an ellipsoid 100 whose long axis aligns with eigenvector $e_1$, i.e. with the direction of the highest apparent diffusion coefficient. The deviation of the ellipsoid 100 from a perfect sphere is representative of the anisotropy of the diffusion tensor. An anisotropic diffusion coefficient tensor can reflect the influence of neural fiber bundles 102 which tend to inhibit diffusion in directions partially or totally orthogonal to the fibers 102, e.g. the directions of eigenvectors $e_2$, $e_3$. In contrast, diffusion parallel to the fibers 102, i.e. channeled along the direction of the major eigenvector $e_1$, is enhanced and larger than along the $e_2$, $e_3$ directions.

With returning reference to FIG. 1, an anisotropy map 50, such as a fractional anisotropy map known to the art, or another anisotropy image map that emphasizes the anisotropy magnitude, is optionally calculated from the ordered eigenvectors and eigenvalues. In a suitable embodiment, an anisotropy map is calculated on a per voxel basis according to:

$$FA = \begin{cases} \sqrt{\dfrac{3\sum_{i=1,2,3}(\lambda_i - \lambda_{avg})^2}{2\sum_{i=1,2,3}\lambda_i^2}}, & \sqrt{\dfrac{1}{3}(\lambda_1^2 + \lambda_2^2 + \lambda_3^2)} \geq 0.10 \\ 0.10, & \sqrt{\dfrac{1}{3}(\lambda_1^2 + \lambda_2^2 + \lambda_3^2)} < 0.10 \end{cases} \quad (3)$$

$$\text{where } \lambda_{avg} = \frac{\lambda_1 + \lambda_2 + \lambda_3}{3}. \quad (4)$$

The anisotropy map of equations (3) and (4) has been found to be particularly suitable for use in selecting fibrous regions for diffusion fiber tracking. As is known to those skilled in the art, the anisotropy map 50 provides a convenient image representation of the anisotropy magnitude. However, it does not include directional information, which makes it unsuitable for tracking or segmenting selected axonal fiber bundles from the large number of crossing, branching, intertwined, or otherwise overlapping fibers and fiber bundles in a neurologically complex region such as the brain or spine.

With continuing reference to FIG. 1, a fiber tracking/interpolation processor 52 segments or tracks axonal fibers or fiber bundles in the diffusion tensor map 44 to produce a fiber representation which is stored in a fiber representation memory 54. The fiber tracking/interpolation processor 52 initiates tracking at one or more seed voxels selected by an associated user.

In a suitable selection process, the user operates a user interface device 58 such as a personal computer or workstation including a graphical display 60, a keyboard 62, a mouse or other pointing device 64, and/or similar input or output elements. The display 60 shows an image representation of the subject 16, for example a slice 66 or other two-dimensional surface through one of the diffusion-weighted images, the $S_o$ image $40_o$, or the anisotropy map 50, extracted by a slice extractor 68. The display 60 also shows a superimposed interactive pointer 69 or other graphical selection tool which is operable by the user through the pointing device 64, the keyboard 62, or other input device to select one or more seed voxels.

Figure 3:
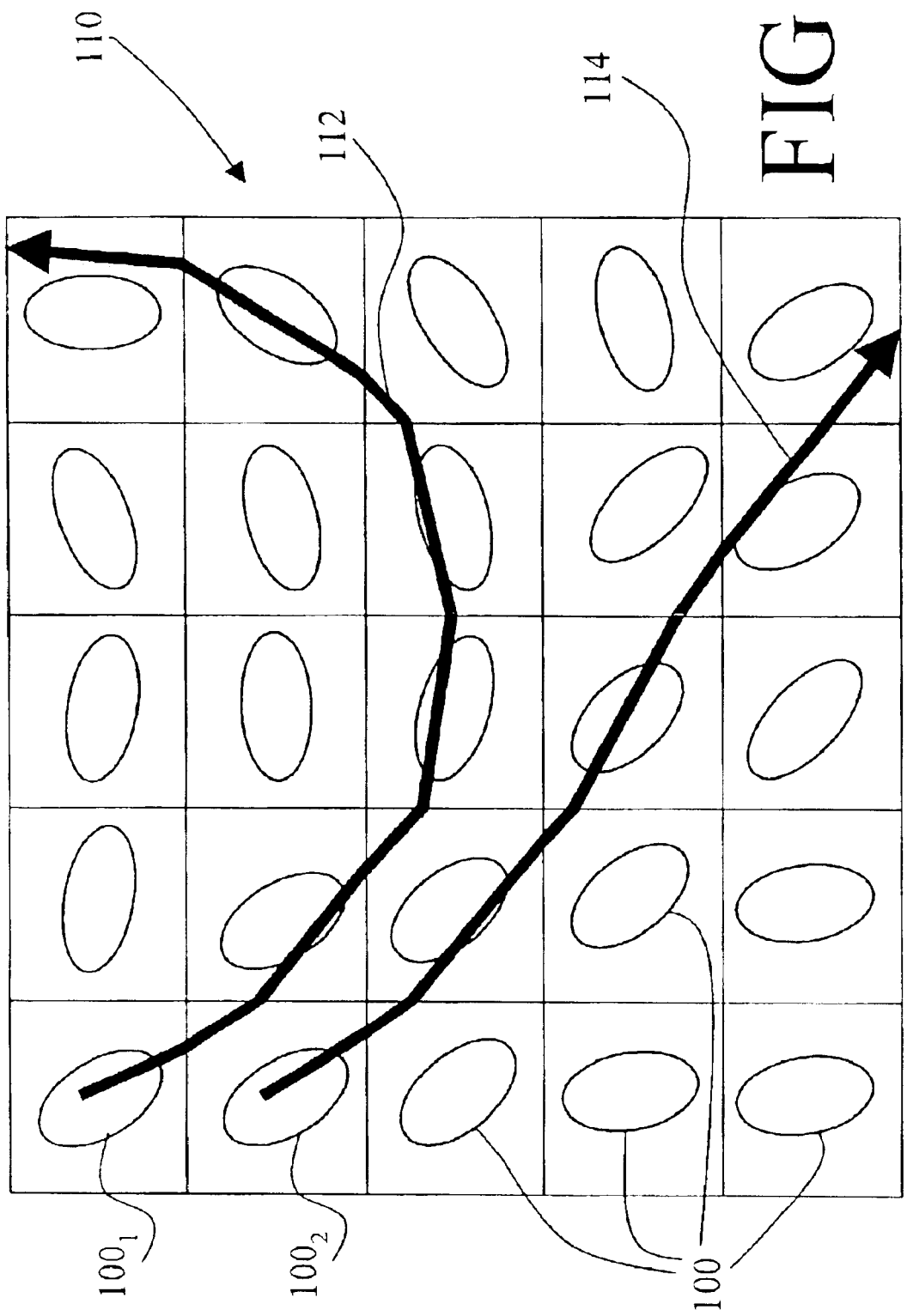
FIG. 3 is a two-dimensional diagrammatical representation of the fiber tracking.

With continuing reference to FIG. 1, returning reference to FIG. 2, and with further reference to FIG. 3 which shows an exemplary two-dimensional diffusion coefficient eigenvector/eigenvalue map 110 in which the anisotropy is geometrically represented by ellipsoids 100, the tracking/interpolation processor 52 iteratively tracks a fiber using a tracking direction given by the major eigenvector $e_1$ of the diffusion tensor of the seed voxel and each subsequent voxel. FIG. 3 shows a first fiber representation track 112 which starts at seed voxel $100_1$, and a second fiber representation track 114 which starts at seed voxel $100_2$.

Although unidirectional tracking is shown in FIG. 3, it will be appreciated that tracking can optionally occur bi-directionally, i.e. extending in both the $e_1$ and the $-e_1$ directions, to provide more complete fiber tracking. Furthermore, although an exemplary two-dimensional array of voxels is shown in FIG. 3, it will be appreciated that the tracking will generally occur three-dimensionally using the three-dimensional diffusion tensor map 44.

With continuing reference to FIG. 1, in addition to the directional tracking the fiber tracking/interpolation processor 52 also performs localized interpolation of tensor voxels in conjunction with the eigenvector/eigenvalue ordering processor 46. The interpolation is localized to the region around the tracking front to reduce computational time and memory loading. It has been found that a bisecting interpolation in the imaging slice plane provides significant smoothing in the tracked fiber representation. To improve tracking accuracy, interpolated voxels are preferably weighted by a parameter related to the diffusion coefficient tensor anisotropy, such as by averaging the eigenvectors and eigenvalues of nearby voxels, or assigning the interpolated voxel a diffusion direction corresponding to a weighted average of the major eigenvector directions of nearby voxels.

The fiber representation 54 is graphically formatted by a rendering processor 70 for user-viewable display on the graphical display device 60 or another output device. The fiber representation 54 is rendered as a line, tube, wire frame, or other graphical representation, on a background such as the anisotropy map 50 or a portion thereof, the static image $40_o$, one of the diffusion weighted images $40_1, \ldots 40_N$, a uniform black or white screen, or the like. Preferably, the rendering processor 70 produces a 3D rendering which can be rotated, resized, or otherwise manipulated by the user via the mouse 64, keyboard 62, or other input device.

Figure 4:
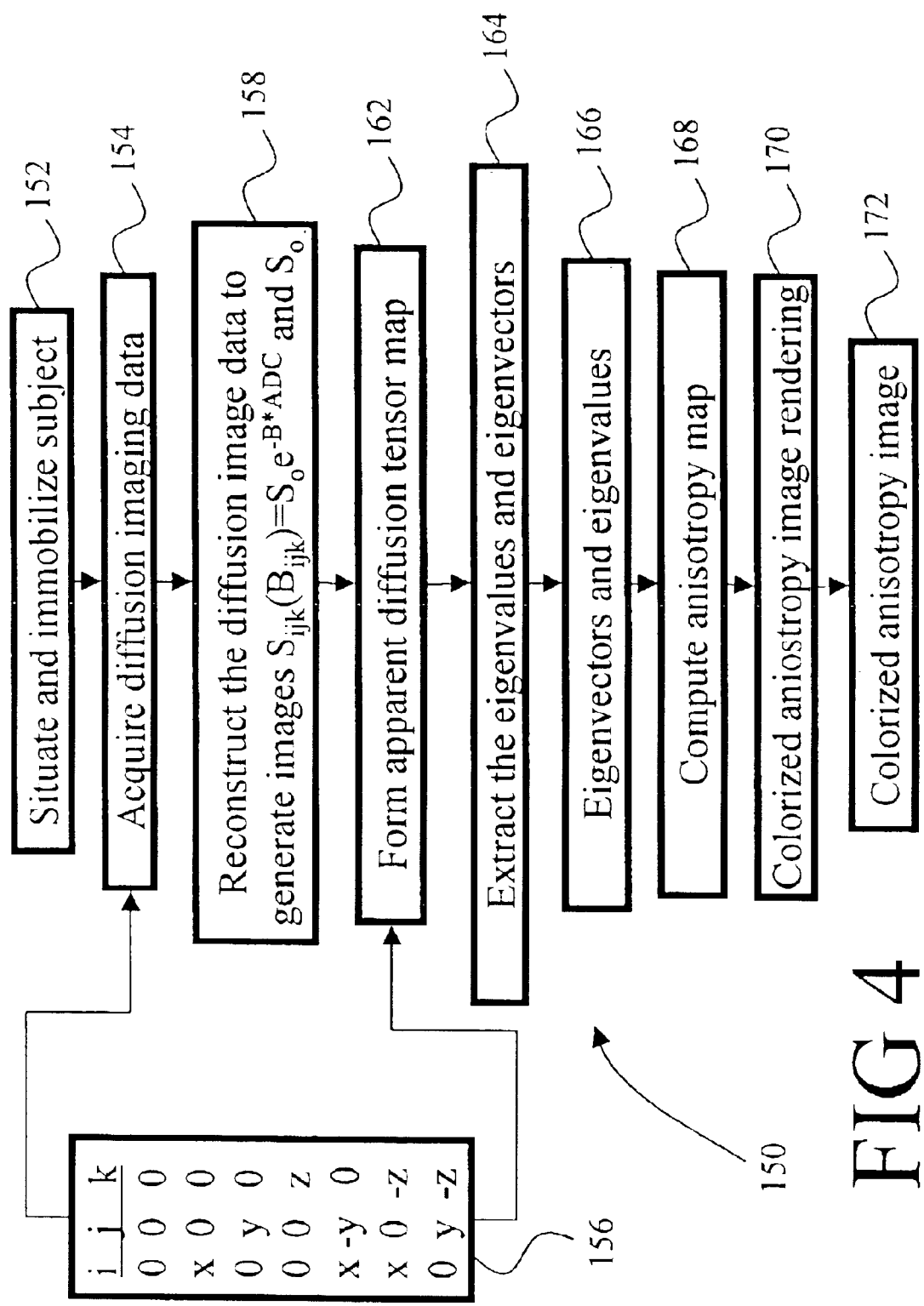
FIG. 4 shows an exemplary process for acquiring diffusion tensor magnetic resonance imaging data and for computing an apparent diffusion coefficient tensor map, obtaining and ordering eigenvalues and eigenvectors, and constructing an anisotropy map.

With reference to FIG. 4, a suitable method 150 for acquiring diffusion tensor magnetic resonance imaging (DT-MRI) data and for generating related spatial mappings and image representations is described. A subject is situated and immobilized within a magnetic resonance imaging (MRI) scanner in a step 152. Because the DT-MRI imaging includes acquisition of a large number of images over a substantial period of time, the subject is preferably immobilized to minimize motion blurring and motion-induced image misregistration between image acquisitions.

The DT-MRI imaging data are acquired in a step 154 using imaging sequences such as spin-echo sequences which include additional magnetic field gradient pulses that produce the selected diffusion weighting. Preferably, a multiple-echo sequence is used in which images are acquired with several diffusion weightings 156 corresponding to selected apparent diffusion coefficient (ADC) components of the diffusion coefficient tensor. Six apparent diffusion coefficients are generally sufficient to describe the tensor. In the illustrated embodiment, Six diffusion weightings 156 are collected, with magnetic field gradient pulses applied in the (x, 0, 0), (0, y, 0), (0, 0, z), (x, −y, 0), (x, 0, −z), and (0, y, −z) directions, along with an unweighted image (0, 0, 0). However, other combinations of diffusion weighting can be used instead. Using a multiple-echo sequence advantageously reduces data acquisition time and minimizes motion-induced blurring or misregistration across images. To improve the signal-to-noise ratio, data for a plurality of images are preferably collected for each diffusion weighting. The imaging sequence also optionally includes additional RF pulses or magnetic field gradient pulses or sweeps to compensate for magnetic field gradient-induced eddy currents and other imaging artifacts.

Image data collected in the step 154 is reconstructed in a step 158 to form diffusion weighted image reconstructions $S_o$ and $S_{ijk}$ where ijk indicates the various weightings 156. An inverse Fourier transform reconstruction known to the art is suitably used, although other reconstruction methods can also be employed.

With the diffusion-weighted images acquired and reconstructed, the apparent diffusion coefficients (ADC's) at each voxel are calculated according to equation (2) using linear regression or another technique and the apparent diffusion coefficient tensor map is constructed in a step 162. The eigenvalues and eigenvectors 166 are extracted in a step 164.

Optionally, an anisotropy map is computed in a step 168, for example in accordance with equations (3) and (4). The anisotropy map is preferably rendered in a step 170, for example by colorizing the voxels based on the anisotropy value, to obtain a colorized anisotropy image 172 for display to an associated user. The anisotropy image 172 provides a convenient medium for the user to select regions of interest for fiber tracking.

Figure 5:
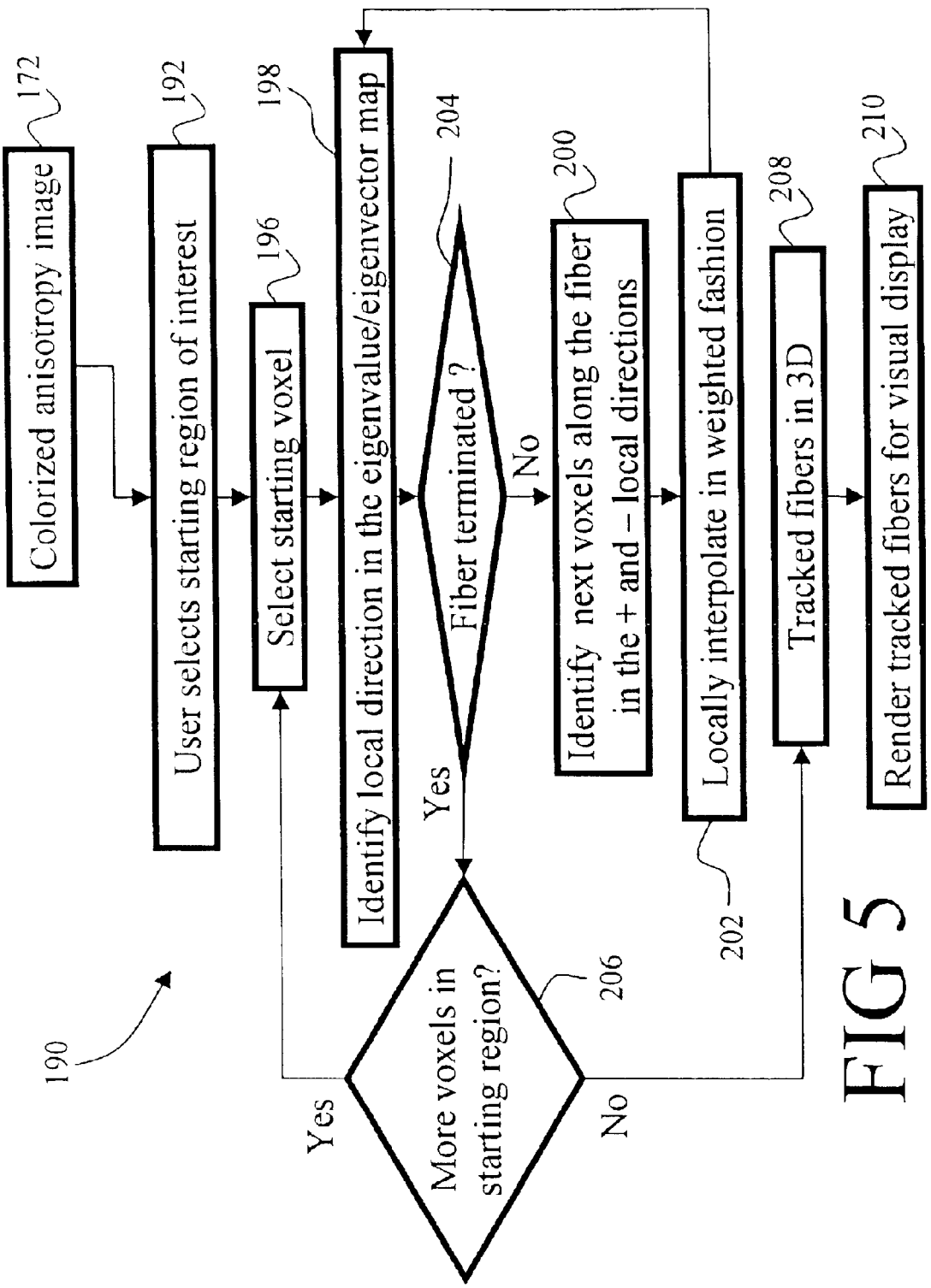
FIG. 5 shows an exemplary fiber tracking process including local weighted interpolation.

With reference to FIG. 5, a suitable method 190 for tracking fibers in the DT-MRI image is described. In a step 192, the user selects a starting region of interest. In a suitable embodiment, the selection 192 is made with reference to the anisotropy image 172 optionally obtained in the DT-MRI imaging method 150 of FIG. 4. The selected starting region of interest is preferably indicated by the user graphically using a mouse pointer or other graphical selection device. The selected region of interest can be a single voxel, a planar region of voxels, or a three-dimensional region of voxels. Optionally, the user can also select an ending region of interest. Such a selection is typically useful for tracking fibers extending between two functional brain regions of deep white matter.

A starting voxel within the selected starting region of interest is selected in a step 196. Beginning with this voxel, a local direction is identified in a step 198 corresponding to the major eigenvector $e_1$ direction (see FIG. 2), for example by ordering the eigenvalues, identifying the largest or major eigenvalue $\lambda_1$, and identifying the direction of the corresponding major eigenvector $e_1$. Next voxels are identified in a step 200 which are nearby the current voxel along the local direction (see FIG. 3). In a preferred embodiment, both positive and negative (bi-directional) tracking is performed by identifying next voxels in both positive and negative local diffusion ($e_1$) directions. As the tracking progresses bi-directionally, a positive fiber end is grown by successively identifying voxels in the positive local direction while a negative fiber end is grown by successively identifying voxels in the negative local direction. Unidirectional fiber tracking is also contemplated for certain situations such as tracking a fiber extending away from a large, dense region of deep white matter.

In a step 202, a localized interpolation is performed in the vicinity of the current tracking front or fronts, i.e. in the vicinity of the next voxel or voxels. The interpolation is preferably localized to the region around the tracking front (or fronts in bi-directional tracking) to reduce computational time and memory loading. In a preferred embodiment, the interpolation is performed in the tensor while obtaining the eigenvectors and eigenvalues so that the tracking front or fronts progress within a higher resolution local diffusion tensor space. The resultant tracked fiber representation will have an improved resolution and smoothness corresponding to the higher interpolated local resolution of the source tensor map.

To maintain tracking accuracy in the interpolated higher resolution local diffusion tensor space, the interpolated voxels are preferably weighted by a parameter related to the local anisotropy. For example, the eigenvectors and eigenvalues of an interpolated voxel are suitably selected as an average of the eigenvectors and eigenvalues of nearby voxels so that the interpolated voxel reflects the local anisotropy. Weighting the plurality of eigenvalues and eigenvectors is computationally expensive, however. To improve fiber tracking speed, it has been found to be sufficient to select an interpolated voxel major eigenvector having a direction corresponding to a weighted average of the major eigenvector directions of adjacent voxels. Optionally, the selected major eigenvector includes a magnitude weighting corresponding to the fractional anisotropy or another anisotropy parameter.

In presently preferred embodiments, the interpolation occurs in a selected planar orientation, typically corresponding to the planar orientation of the acquired image slices, e.g. an axial planar orientation for an image constructed from axial acquisition slices. However, it is also contemplated to interpolate on planar orientations other than the principle sagittal, coronal, and axial body planar orientations. For example, the interpolation optionally can occur on a planar orientation containing the major eigenvector $e_1$ and the medium eigenvector $e_2$ (see FIG. 2) so that the interpolation occurs along those planes most likely to correspond to the fiber direction. In this contemplated embodiment, the planar orientation shifts and rotates with the orientation of the local anisotropy of the growing fiber end. It is also contemplated to perform a three-dimensional interpolation. For example, linear interpolation can double the planar resolution in each interpolated direction, i.e. a 128×128 voxel plane is interpolated to provide 256×256 voxel resolution. Optionally, similar interpolation is performed in the inter-slice direction.

The method 190 iteratively repeats the steps 198, 200, 202 to grow the tracked fiber either uni-directionally or bi-directionally. Preferably, a decision step 204 within the iterative loop checks for a termination of a progressing fiber end. One suitable fiber termination criterion includes a fractional anisotropy or other anisotropy magnitude parameter below a selected value, e.g. at or below the FA=0.10 threshold used in equation (3). Since a low anisotropy corresponds with a highly isotropic diffusion tensor, it is reasonable to associate an anisotropy parameter value that drops below a selected threshold with the terminal point of a tracked fiber.

Another suitable fiber termination criterion is a change in local direction between successive voxels which is greater than a selected angle. A large change in local direction is likely to correspond to a fiber branching point. Optionally, instead of terminating at such an apparent branching point, a new region of interest is defined at or around the branching point and the tracking process 190 is repeated for the new region of interest to track the branching fibers or fiber bundles.

Yet another suitable fiber termination criterion is entrance of the progressing fiber into an ending region of interest selected by the user in the step 192. Various combinations of the exemplary terminating criteria described herein, and/or addition or substitution of other suitable terminating criteria, are also contemplated.

If the decision step 204 indicates that the fiber has terminated, the method preferably checks whether all voxels of the region of interest have been visited in a decision step 206. If unvisited voxels still exist in the region of interest, another starting voxel is selected in the step 196 and the tracking steps 198, 200, 202, 204 are iteratively repeated. Repetitive iterative tracking starting at each starting voxel in the region of interest collectively produces a three-dimensional tracked fibers representation 208 representative of one or more tracked fibers or fiber bundles. The tracked fibers representation is preferably graphically rendered and displayed in a step 210 for visualization by a human user, e.g. using a wire-mesh 3D rendering, 3D tubular 3D rendering, other type of rendering. The rendering is preferably interactive so that the user can highlight selected fibers, rotate the three-dimensional fiber representation, or otherwise manipulate the data.

The invention has been described with reference to axonal fiber tracking in the brain. However, those skilled in the art will appreciate that the invention is also applicable to other anatomies, such as the spine, kidneys, and heart, in which substantial fibrous or anisotropic tissue densities are present.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. An imaging method for imaging a subject including anisotropic structures, the method comprising:

with a magnetic resonance scanner acquiring a three-dimensional apparent diffusion tensor map of at least a portion of the subject including at least some anisotropic structures;

processing the apparent diffusion tensor at a voxel to obtain eigenvectors and eigenvalues;

extracting a three-dimensional fiber representation using the eigenvectors and eigenvalues;

during the extracting, locally spatially interpolating voxels in at least a selected spatial dimension in a vicinity of the fiber representation, the spatial interpolating including weighting the interpolated voxels by a parameter indicative of a local anisotropy, the interpolating resulting in a three-dimensional fiber representation having a higher resolution than the acquired tensor map; and producing a human-viewable display of the three-dimensional fiber representation.

2. An imaging method comprising:

acquiring a three-dimensional apparent diffusion tensor map of at least a portion of the subject including anisotropic structures using magnetic resonance imaging;

processing the apparent diffusion tensor at a voxel to obtain eigenvectors and eigenvalues;

extracting a three-dimensional fiber representation using the eigenvectors and eigenvalues;

during the extracting, locally interpolating voxels relative to a selected spatial dimension in a vicinity of the fiber representation, the interpolating including weighting the interpolated voxels by one of:

a direction of a major diffusion tensor eigenvector, a functional combination of diffusion tensors, and a fractional anisotropy, to produce a three-dimensional fiber representation having a higher resolution than the acquired tensor map.

3. The imaging method as set forth in claim 1, wherein the extracting of a three-dimensional fiber representation includes:

receiving a selection of a starting region in the apparent diffusion tensor map;

selecting a voxel in the starting region;

determining a local direction based on the diffusion tensor eigenvectors and eigenvalues of the selected voxel;

identifying a next voxel along the local direction; and repeating the determining of a local direction and the identifying of a next voxel a plurality of times to extract the three-dimensional fiber representation.

4. The imaging method as set forth in claim 3, wherein the identifying of a next voxel includes identifying a spatially interpolated voxel.

5. The imaging method as set forth in claim 3, wherein the local spatially interpolating of voxels in at least a selected spatial dimension in a vicinity of the fiber representation includes:

interpolating at least one voxel between the selected voxel and another voxel neighboring the selected voxel along the local spatial direction.

6. The imaging method as set forth in claim 3, wherein extracting of a three-dimensional fiber representation further includes:

terminating the repeating responsive to entrance of the next voxel into a user-selected ending region of interest.

7. The imaging method as set forth in claim 3, wherein the receiving of a selection of a starting region includes:

producing a human-viewable selection display of an image representation that is representative of at least a portion of the three-dimensional apparent diffusion tensor map; and superimposing on the selection display a graphical selection tool operable by an associated user for selecting the starting region.

8. The imaging method as set forth in claim 7, wherein the selection display is selected from a group consisting of:

a magnetic resonance image, and an anisotropy image derived from diffusion tensor magnetic resonance imaging.

9. The imaging method as set forth in claim 1, wherein the acquiring of a three-dimensional diffusion tensor map includes:

acquiring diffusion weighted magnetic resonance image representations; and computing the diffusion tensor map from the acquired diffusion weighted magnetic resonance image representations.

10. The imaging method as set forth in claim 9, wherein the computing of the diffusion tensor map includes:

determining apparent diffusion tensor components from the acquired diffusion weighted magnetic resonance image representations by linear regression.

11. An apparatus for tracking fibrous structures in a subject, the apparatus comprising:

a magnetic resonance imaging scanner configured to acquire diffusion-weighted imaging data;

a reconstruction processor which reconstructs the acquired diffusion-weighted imaging data into diffusion-weighted image representations;

a diffusion tensor mapping processor that constructs a diffusion tensor map by selectively combining selected diffusion-weighted image representations;

an eigenvalues/eigenvector processor that determines ordered eigenvalues and eigenvectors of the diffusion tensor corresponding to voxels;

a fibrous structure tracking processor that computes a fibrous structure representation based on voxel eigenvalues and eigenvectors and at least one starting voxel selection;

an interpolation processor cooperating with the fibrous structure tracking processor that increases a spatial resolution of the fibrous structure representation by locally spatially interpolating voxels in a neighborhood of the fibrous structure during computation of the fibrous structure representation; and a display device that displays at least a portion of the fibrous structure representation in a human-viewable medium.

12. The apparatus as set forth in claim 11, wherein the diffusion tensor mapping processor includes:

a linear regression processor that uses linear regression to compute an apparent diffusion tensor coefficient from a plurality of diffusion-weighted images.

13. The apparatus as set forth in claim 11, further including:

an anisotropy mapping processor that computes an anisotropy map with voxels corresponding to an anisotropy magnitude parameter, the anisotropy map used for selection of the at least one starting voxel.

14. An apparatus for tracking fibrous structures in a subject, the apparatus comprising:
a magnetic resonance imaging scanner configured to acquire diffusion-weighted imaging data;
a reconstruction processor which reconstructs the acquired diffusion-weighted imaging data into diffusion-weighted image representations;
a diffusion tensor mapping processor that constructs a diffusion tensor map by selectively combining selected diffusion-weighted image representations;
an eigenvalues/eigenvectors processor that determines ordered eigenvalues and eigenvectors of the diffusion tensor corresponding to voxels;
a fibrous structure tracking processor that computes a fibrous structure representation based on voxel eigenvalues and eigenvectors and at least one starting voxel selection, the fibrous structure tracking processor including:
a directional processor that identifies a local fiber direction corresponding to an eigenvector direction associated with the largest eigenvalue of the selected voxel,
an incremental processor that identifies a voxel near the selected voxel along the local fiber direction, and
a looping processor that repetitively invokes the directional processor and the incremental processor to iteratively compute the fibrous structure representation;
an interpolation processor cooperating with the fibrous structure tracking processor that increases a resolution of the fibrous structure representation by locally interpolating voxels in a neighborhood of the fibrous structure during computation of the fibrous structure representation; and
a display device that displays at least a portion of the fibrous structure representation in a human-viewable medium.

15. The apparatus as set forth in claim 14, wherein the interpolation processor includes:
a positioning processor that identifies an interpolated voxel position located between neighboring voxels of the diffusion tensor map near the selected voxel; and
a value processor that weightedly combines apparent diffusion tensors of at least one of the selected voxel and a neighboring voxel to obtain an interpolated voxel value.

16. The apparatus as set forth in claim 14, wherein the interpolation processor locally interpolates voxels in one of a two-dimensional surface and a volume containing the selected voxel.

17. The apparatus as set forth in claim 14, wherein the interpolation processor includes:
a positioning processor that identifies an interpolated voxel position between neighboring voxels of the apparent diffusion tensor map near the selected voxel; and
a directional value processor that weightedly combines diffusion directions of neighboring voxels to obtain a weighted directional value for the interpolated voxel.

18. A method for tracking fibrous structures in magnetic resonance images, the method comprising:
generating magnetic resonance imaging data from a region containing fibrous structures to be tracked;
reconstructing the magnetic resonance imaging data into an apparent diffusion tensor map including a three-dimensional arrangement of diffusion tensor voxels;
selecting a starting voxel;
beginning at the starting voxel, iteratively following an eigenvector corresponding to a largest eigenvalue from voxel to voxel to construct a three-dimensional fiber representation; and
during the iterative following, locally spatially interpolating voxels, the locally spatially interpolated voxels being weighted combinations of diffusion tensors of nearby voxels.

19. The tracking method as set forth in claim 18, wherein the locally spatially interpolated voxels are generated along a selected spatial orientation.

20. The tracking method as set forth in claim 18, wherein the generating of locally spatially interpolated voxels for use in the iterative following step includes:
adding locally spatially interpolated diffusion tensor voxels into the diffusion tensor map, the added diffusion tensor voxels being weighted based on the eigenvalues and eigenvectors of nearby voxels.

21. The tracking method as set forth in claim 20, wherein weighting of the added diffusion tensor voxels is selected from a group consisting of a local anisotropy weighting and a weighting based on a major eigenvector direction.

22. The tracking method as set forth in claim 18, wherein the local spatial interpolating includes:
producing a higher resolution local tensor space including the locally spatially interpolated voxels, the iterative following occurring within the higher resolution local interpolated tensor space.

23. An imaging apparatus for imaging a subject including anisotropic structures, the apparatus comprising:
a magnetic resonance imaging scanner configured to acquire a three-dimensional apparent diffusion tensor map of at least a portion of the subject including at least some anisotropic structures;
a means for processing the apparent diffusion tensor at a voxel to obtain eigenvectors and eigenvalues;
a means for extracting a three-dimensional fiber representation using the eigenvectors and eigenvalues;
a means for locally spatially interpolating voxels in at least a selected spatial dimension in a vicinity of the fiber representation during the extracting, the spatial interpolating means including a means for weighting the interpolated voxels by a parameter indicative of a local anisotropy, the interpolating resulting in a three-dimensional fiber representation having a higher resolution than the acquired tensor map; and
a means for producing a human-viewable display of the three-dimensional fiber representation.

24. An imaging apparatus comprising:
a magnetic resonance imaging means configured for acquiring a three-dimensional apparent diffusion tensor map of at least a portion of the subject including anisotropic structures;
a means for processing the apparent diffusion tensor at a voxel to obtain eigenvectors and eigenvalues;
a means for extracting a three-dimensional fiber representation using the eigenvectors and eigenvalues;
a means for locally interpolating voxels relative to a selected spatial dimension in a vicinity of the fiber representation during the extracting, the interpolating including weighting the interpolated voxels by one of:
a direction of a major diffusion tensor eigenvector,
a functional combination of diffusion tensors, and
a fractional anisotropy, to produce a three-dimensional fiber representation having a higher resolution than the acquired tensor map.

25. An imaging apparatus comprising:

a MR imaging scanner which non-invasively examines a subject and generating an apparent diffusion tensor map including a three-dimensional arrangement of diffusion tensor voxels;

a processor which tracks fibrous structures in the apparent diffusion tensor map, the processor being programmed to perform the steps of:

selecting a starting voxel;

beginning at the starting voxel, iteratively following an eigenvector corresponding to a largest eigenvalue from voxel to voxel to construct a three-dimensional fiber representation; and, during the iterative following, locally spatially interpolating voxels, the locally spatially interpolated voxels being weighted combinations of diffusion tensors of nearby voxels.

* * * * *